NAND NOR LOGIC CIRCUIT FOR USE IN A BINARY COMPARATOR

Filed Aug. 29, 1963

INVENTOR.
WILLIAM F. GARIANO

BY Donald S. Cohen

ATTORNEY

United States Patent Office 3,281,607

Patented Oct. 25, 1966

3,281,607

NAND NOR LOGIC CIRCUIT FOR USE IN A BINARY COMPARATOR

William F. Gariano, Newtown Square, Pa., assignor to International Resistance Company, Philadelphia, Pa.

Filed Aug. 29, 1963, Ser. No. 305,471
2 Claims. (Cl. 307—88.5)

The present invention relates to a binary comparator circuit and a logic gate circuit used therein. More particularly, the present invention relates to a binary comparator circuit utilizing transistor-transistor logic gate circuits which can be easily made up as miniaturized circuits.

In the electronic industry the trend toward miniaturization has led not only to miniaturized electrical components, but also to miniaturized circuitry, generally referred to as microcircuits. Such microcircuits comprise a small, flat wafer having various electrical components either formed or mounted thereon, and electrically connected together in the desired circuit. In one type of microcircuit, generally known as an integrated circuit, the components, both passive and active, are all formed directly on or in the wafer. In another type, generally known as a hybrid circuit, the passive components, such as the resistors and capacitors, are formed directly on the wafer, and the active components, such as the transistors and diodes, are separate pieces which are mounted on the wafer.

For ease of manufacturing microcircuits, it is not only desirable that the circuit contain a minimum number of components, but also that it contain a minimum number of different types of components. Therefore, for this and other reasons, it has been found desirable in making certain types of microcircuits to use transistorized logic circuits.

It is an object of the present invention to provide a novel binary comparator circuit.

It is another object to provide a binary comparator circuit utilizing transistorized logic circuits.

It is still another object to provide a binary comparator circuit which can be easily formed as a miniaturized circuit.

It is a further object to provide a novel NAND-NOR logic circuit.

It is a still further object to provide a novel transistorized NAND-NOR logic circuit.

Other objects will appear hereinafter.

For the purpose of illustrating the invention there is shown in the drawings a form which is presently preferred; it being understood, however, that this invention is not limited to the precise arrangements and instrumentalities shown.

Figures 1, 2, 3, 4, 5:
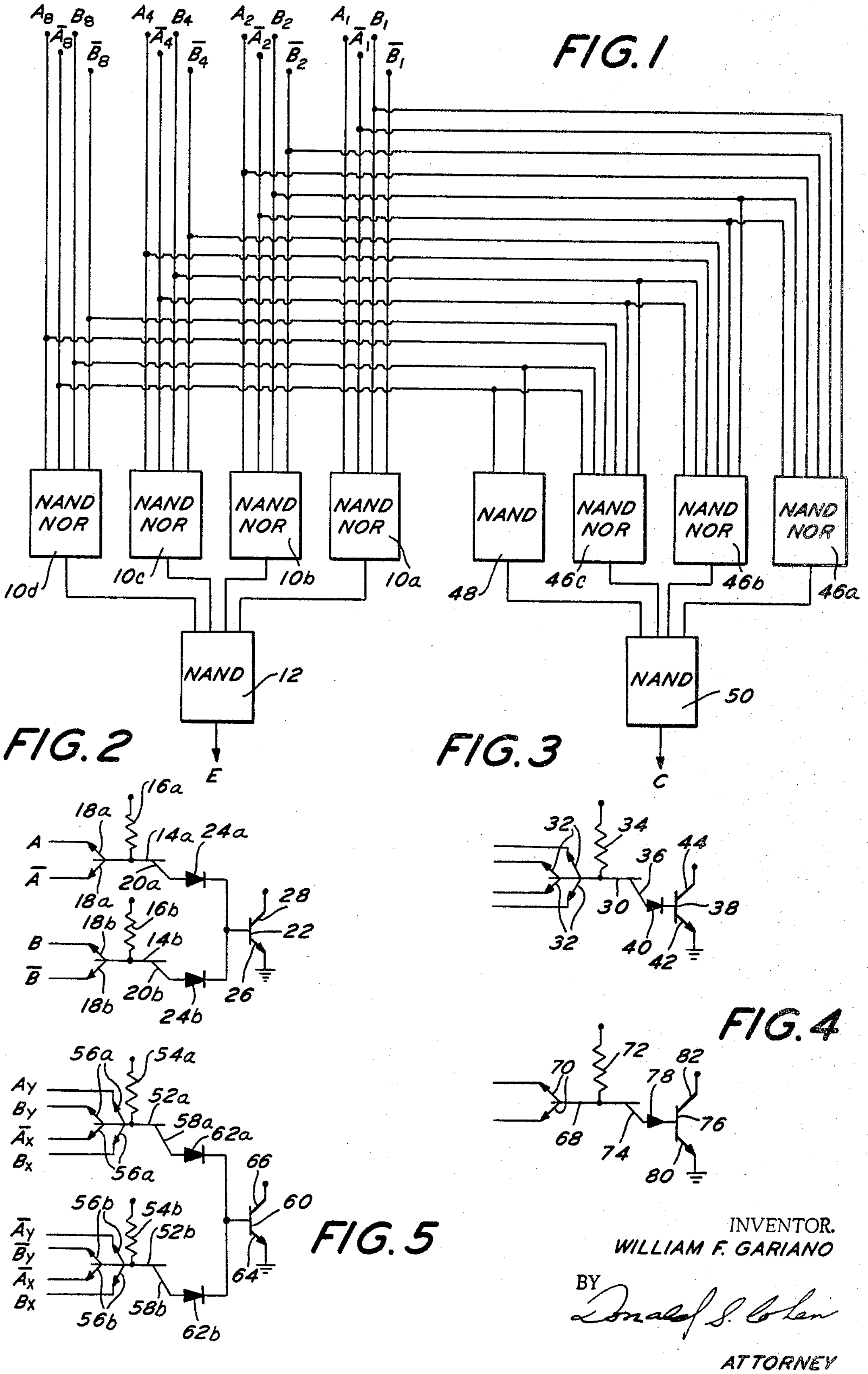
FIGURE 1 is a schematic diagram of the binary comparator circuit of the present invention.
FIGURE 2 is a circuit diagram of one of the transistorized NAND-NOR logic gates used in the comparator of the present invention.
FIGURE 3 is a circuit diagram of one of the transistorized NAND logic gates used in the comparator of the present invention.
FIGURE 4 is a circuit diagram of another one of the transistorized NAND logic gates used in the comparator of the present invention.
FIGURE 5 is a circuit diagram of another one of the transistorized NAND-NOR logic gates used in the comparator of the present invention.

The comparator of the present invention serves to compare the outputs of two binary registers to determine whether the registers are equal or unequal. If the registers are unequal, the comparator will determine which register is greater than the other. Referring to FIGURE 1, the comparator of the present invention comprises an "equality circuit" and a "sign out" circuit. The equality circuit provides an output signal, indicated as E, which indicates whether the two registers are equal or unequal. The sign out circuit provides an output signal, indicated as C, which, when the registers are unequal, indicates which register is greater than the other.

The equality circuit of the comparator of the present invention comprises four NAND-NOR logic gates 10*a*, 10*b*, 10*c* and 10*d*, each having four inputs and an output. The inputs of NAND-NOR gate 10*a* are connected to the outputs of the first binary digit of the two registers being compared, indicated by $A_1$, $\overline{A}_1$, $B_1$ and $\overline{B}_1$. As used herein, A and B refer to the 1 output terminal of the register, and $\overline{A}$ and $\overline{B}$ refer to the 0 output terminals. The inputs of NAND-NOR gates 10*b*, 10*c* and 10*d* are are likewise connected to the outputs of the respective other binary digits of the two registers being compared. The outputs of the NAND-NOR gates 10*a*, 10*b*, 10*c* and 10*d* are connected to the input of a NAND gate 12. The output of NAND gate 12 provides the equality signal E.

Referring to FIGURE 2, each of NAND-NOR gates 10*a*, 10*b*, 10*c* and 10*d* comprises a pair of coupling transistors 14*a* and 14*b*. The bases of the coupling transistor 14*a* and 14*b* are connected to a control voltage through resistors 16*a* and 16*b* respectively. Coupling transistor 14*a* has a pair of emitters 18*a* which are the input terminals of the NAND-NOR gate and are connected to the outputs of the binary digit of one of the registers, such as outputs A and $\overline{A}$. Likewise, coupling transistor 14*b* has a pair of emitters 18*b* which are connected to the outputs of the binary digit of the other register, such as outputs B and $\overline{B}$. The collectors 20*a* and 20*b* of the coupling transistors 14*a* and 14*b* are connected to the base of an inverter transistor 22 through separate diodes 24*a* and 24*b* respectively. The emitter 26 of the inverter transistor 22 is grounded. The collector 28 of the inverter transistor 22 is the output terminal of the NAND-NOR gate which is connected to the input of the NAND gate 12.

Referring to FIGURE 3, NAND gate 12 comprises a coupling transistor 30 having four emitters 32. Emitters 32 are the input terminals of the NAND gate 12 and are connected to the output terminals of the NAND-NOR gates 10*a*, 10*b*, 10*c* and 10*d*. The base of coupling transistor 30 is connected to a control voltage through a resistor 34. The collector 36 of coupling transistor 30 is connected to the base of an inverter transistor 38, preferably through a diode 40. The emitter 42 of the inverter transistor 38 is grounded, and the collector 44 is the output terminal of the NAND gate 12.

The sign out circuit of the comparator of the present invention comprises three NAND-NOR logic gates 46*a*, 46*b* and 46*c*, and a NAND gate 48. As shown in FIGURE 1, each of the NAND-NOR gates 46*a*, 46*b* and 46*c* has six input terminals and the NAND gate 48 has two input terminals. Two of the input terminals of NAND-NOR gates 46*a* are connected respectively to the 0 output terminal of the first digit of one register, and the 1 output terminal of the first digit of the other register, the $\overline{A}_1$ and $B_1$ terminals. The other four input terminals of NAND-NOR gate 46 are connected to a separate terminal of the input terminals of the next higher digit of the two registers, the number 2 digit. Two of the input terminals of NAND-NOR gate 46*b* are connected respectively to the 0 output terminal of the number 2 digit of the one register and the 1 output terminal of the number 2 digit of the other register, the $\overline{A}_2$ and $B_2$ terminals. The other four terminals of NAND-NOR gate 46*b* are connected to separate terminals of the output terminals of the next higher digit of the two registers, the number 4 digit. Likewise, two of the input terminals of NAND-NOR gate 46*c* are connected respectively to the 0 output terminal of the number 4 digit of the one register, and the 1 output terminal of the number 4 digit of the other register, the $\overline{A}_4$ and $B_4$ terminals. The other four input terminals of NAND-NOR gate 46*c* are connected to separate terminals of the output terminals of the next higher digit of the two registers, the number 8 digit. The two terminals of the NAND gate 48 are connected to the 0 output terminal of the number 8 digit of the one register, and the 0 terminal of the number 8 digit of the other register, the $\overline{A}_8$ and $B_8$ terminals. The output terminals of NAND-NOR gates 46*a*, 46*b* and 46*c* and the NAND gate 48 are connected to the input of a NAND gate 50. The output of NAND gate 50 provide gate 50 provides the sign out signal C.

Referring to FIGURE 5, each of NAND-NOR gates 46*a*, 46*b* and 46*c* comprises a pair of coupling transistors 52*a* and 52*b*. The bases of the coupling transistors 52*a* and 52*b* are connected to a control voltage through resistors 54*a* and 54*b* respectively. Each of the coupling transistors 52*a* and 52*b* has four emitters 56*a* and 56*b* respectively, which are connected to the various output terminals of the two digits of the two registers. As shown in FIGURE 5, the subscript *x* refers to the lower digit, and the subscript *y* to the higher digit. Although in FIGURE 1, each of the NAND-NOR gates 46*a*, 46*b* and 46*c* is shown as having six input terminals, it should be noted from FIGURE 5 that the $\overline{A}_x$ and $B_x$ terminals of each digit of the registers are electrically connected to the emitters of both of the coupling transistors 52*a* and 52*b*. The other two emitters of coupling transistor 52*a* are connected to the $A_y$ and $B_y$ terminals of the registers, and the other two emitters of coupling transistor 52*b* are connected to the $\overline{A}_y$ and $\overline{B}_y$ of the registers. The collectors 58*a* and 58*b* of the coupling transistors 52*a* and 52*b* are connected to the base of an inverter transistor 60 through separate diodes 62*a* and 62*b*. The emitter 64 of the inverter transistor 60 is grounded, and the collector 66 thereof is the output of the NAND-NOR gate. By comparing FIGURES 2 and 5, it can be seen that NAND-NOR gates 10*a*, 10*b*, 10*c* and 10*d* are identical to NAND-NOR gates 46*a*, 46*b* and 46*c* except for the number of input terminals.

Referring to FIGURE 4, NAND gate 48 comprises a coupling transistor 68 having a pair of emitters 70 which are connected to the $\overline{A}$ and B terminals of the highest digit of the registers. The base of coupling transistor 68 is connected to a control voltage through a resistor 72. The collector 74 of coupling transistor 68 is connected to the base of an inverter transistor 76 preferably through a diode 78. The emitter 80 of inverter transistor 76 is grounded, and the collector 82 is the output terminal of the NAND gate 48. The NAND gate 50 is identical to the NAND gate 12 as shown in FIGURE 3.

The equality circuit E and the sign out circuit C of the comparator of the present invention can be expressed by the following logic equations:

$$E=(A_8\cdot\overline{B}_8+\overline{A}_8\cdot B_8)+(A_4\cdot\overline{B}_4+\overline{A}_4\cdot B_4)+(A_2\cdot\overline{B}_2)+(\overline{A}_2\cdot B_2)+(A_0\cdot\overline{B}_0+\overline{A}_0\cdot B_0)$$

$$C=(\overline{A}_8\cdot B_8)+(\overline{S}_8\cdot\overline{A}_4\cdot B_4)+(\overline{S}_4\cdot\overline{A}_2\cdot B_2)+(\overline{S}_2\cdot\overline{A}_0\cdot B_0)$$

where $$\overline{S}_x=(A_x\cdot B_x)+(\overline{A}_x+\overline{B}_x)$$

Using these equations, the operation of the comparator of the present invention can be seen from the following examples:

*Example I*

Assuming that each of the registers indicates the same number, for example 5, the binary digits of each of the registers will be in the condition shown in the first line of Table I. Now inserting this information in the above logic equations for the comparator of the present invention, $$E=(0\cdot 1+1\cdot 0)+(1\cdot 0+0\cdot 1)+(0\cdot 1+1\cdot 0)+(1\cdot 0+0\cdot 1)=0$$

$$C=(1\cdot 0)+(1\cdot 0\cdot 1)+(1\cdot 1\cdot 0)+(1\cdot 0\cdot 1)=0$$

*Example II*

Assuming that register A indicates 5, and register B indicates 3, the binary digits of the registers will be in the condition shown in the second line of Table I. Inserting this information in the logic equations for the comparator of the present invention, $$E=(0\cdot 1+1\cdot 0)+(1\cdot 1+0\cdot 0)+(0\cdot 0+1\cdot 1)+(1\cdot 0+0\cdot 1)=1$$

$$C=(1\cdot 0)+(1\cdot 0\cdot 0)+(0\cdot 1\cdot 1)+(0\cdot 0\cdot 1)=0$$

*Example III*

Assuming that register A indicates 3 and register B indicates 5, the binary digits of the registers will be in the condition shown in the third line of Table I. Inserting this information in the logic equations for the comparator of the present invention, $$E=(0\cdot 1+1\cdot 0)+(0\cdot 0+1\cdot 1)+(1\cdot 1+0\cdot 0)+(1\cdot 0+0\cdot 1)=1$$

$$C=(1\cdot 0)+(1\cdot 1\cdot 1)+(0\cdot 0\cdot 0)+(0\cdot 0\cdot 1)=1$$

TABLE I

| | $A_1$ | $\overline{A}_1$ | $B_1$ | $\overline{B}_1$ | $A_2$ | $\overline{A}_2$ | $B_2$ | $\overline{B}_2$ | $A_4$ | $\overline{A}_4$ | $B_4$ | $\overline{B}_4$ | $A_8$ | $\overline{A}_8$ | $B_8$ | $\overline{B}_8$ |
|---|---|---|---|---|---|---|---|---|---|---|---|---|---|---|---|---|
| A=5 B=5 | 1 | 0 | 1 | 0 | 0 | 1 | 0 | 1 | 1 | 0 | 1 | 0 | 0 | 1 | 0 | 1 |
| A=5 B=3 | 1 | 0 | 1 | 0 | 0 | 1 | 1 | 0 | 1 | 0 | 0 | 1 | 0 | 1 | 0 | 1 |
| A=3 B=5 | 1 | 0 | 1 | 0 | 1 | 0 | 0 | 1 | 0 | 1 | 1 | 0 | 0 | 1 | 0 | 1 |

The results of the above three examples are shown in Table II. It can be seen from this table that when there is no signal from the equality circuit E, the two registers are equal, and when there is a signal from the equality circuit, the two registers are unequal. When the two registers are unequal, as indicated by a signal from the equality circuit, no signal from the sign out circuit C indicates that register A is greater than register B, and a signal from the sign out circuit indicates that register A is smaller than register B.

TABLE II

| C | E | Compare |
|---|---|---|
| 0 | 0 | A=B |
| 0 | 1 | A>B |
| 1 | 1 | A<B |

The indications of the comparator of the present invention as shown in Table II are obtained with the sign out circuit connected to the digits of the registers in the manner shown in FIGURE 1. However, if the two terminals of each of the NAND-NOR gates **46*a*, 46*b* and 46*c* and the NAND gate 48** are connected to the A and $\overline{B}$ terminals of the digits instead of the $\overline{A}$ and B terminals, the indications from the sign out circuit will be reversed. Thus, when the equality circuit indicates the registers are unequal, a signal from the sign out circuit will indicate register A is greater than register B, and no signal from the sign out circuit will indicate register A is smaller than register B.

For higher order binary numbers than shown in FIGURE 1, the equality circuit is provided with an additional NAND-NOR gate for each additional digit. In the sign out circuit, the NAND gate 48 is connected to the highest binary position, and there is provided a NAND-NOR gate, such as the NAND-NOR gates **46*a*, 46*b* and 46*c***, for each of the other digits.

In the transistorized NAND-NOR logic gates of the present invention shown in FIGURES 2 and 5, it has been found necessary to include the diodes between each of the coupling transistors and the inverter transistor to insure proper operation of the NAND-NOR gate at all times. For proper operation of these transistorized NAND-NOR gates, it is necessary that a signal from either coupling transistor operate the inverter transistor. However, under certain worse case conditions, such as when the components of the gate circuit are at their limits of tolerance, the output voltage from the coupling transistors may be too small to turn-off the inverter transistor. It has been found that by inserting the diode between the coupling transistors and the inverter transistor, there is always obtained a voltage drop across the diode large enough to turn-off the inverter transistor even though the voltage output from the coupling transistor may be too small for this purpose.

Thus the diode is incorporated in the circuit to insure that the inverter transistor is turned-off when all the inputs are turned-on. A resistor or resistor-capacitor combination may be used, but for reasons of speed and low forward potential conduction, the diode is preferred. A transistor may also be employed to insure that $\overline{V_{BER}}$ (maximum required base emitter voltage) is lower than the threshold value for turning-on the inverter transistor. Hence there is insured proper operation of the transistorized NAND-NOR logic gates of the present invention at all times.

The present invention may be embodied in other specific forms without departing from the spirit or essential attributes thereof and, accordingly, reference should be made to the appended claims, rather than to the foregoing specification as indicating the scope of the invention.

I claim:

1. A NAND-NOR logic gate comprising a pair of coupling transistors each having a plurality of emitters, a collector and a base; a separate resistor connected to the base of each of said coupling transistors, an inverter transistor having an emitter, collector and base, the base of said inverter transistor being coupled to the collectors of each of said coupling transistors; and means in the coupling between the base of the inverter transistor and each of the collectors of the coupling transistors for providing a suitable potential difference to insure that the inverter transistor is off when the coupling transistors are conducting between their base and emitters; the emitters of the coupling transistors being the input terminals of the gate, and the collector of the inverter transistor being the output terminal of the gate.

2. A NAND-NOR logic gate in accordance with claim 1 in which the means in the coupling between the base of the inverter transistor and each of the collectors of the coupling transistors is a diode.

References Cited by the Examiner

UNITED STATES PATENTS

| | | | |
|---|---|---|---|
| 2,907,877 | 10/1959 | Johnson | 250—27 |
| 3,032,664 | 5/1962 | Rowe | 307—88.5 |
| 3,091,392 | 5/1963 | Arya | 235—177 |
| 3,093,751 | 6/1963 | Williamson | 307—88.5 |
| 3,178,590 | 4/1965 | Heilweil et al. | 307—88.5 |
| 3,196,262 | 7/1965 | Thompson | 235—177 |

ROBERT C. BAILEY, *Primary Examiner.*

G. D. SHAW, *Assistant Examiner.*